United States Patent
Kurita et al.

(10) Patent No.: US 6,323,434 B1
(45) Date of Patent: Nov. 27, 2001

(54) CIRCUIT BOARD AND PRODUCTION METHOD THEREOF

(75) Inventors: Hideyuki Kurita, Tokyo; Satoshi Takahashi, Tochigi; Akira Tsutsumi, Tochigi; Masahiro Fujimoto, Tochigi, all of (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/194,161

(22) PCT Filed: Mar. 20, 1998

(86) PCT No.: PCT/JP98/01209

§ 371 Date: Nov. 20, 1998

§ 102(e) Date: Nov. 20, 1998

(87) PCT Pub. No.: WO98/43295

PCT Pub. Date: Oct. 1, 1998

(30) Foreign Application Priority Data

Mar. 21, 1997 (JP) .................................................... 9-087433

(51) Int. Cl.[7] ...................................................... H05K 1/09

(52) U.S. Cl. .......................... 174/255; 174/524; 174/257; 257/673; 257/778

(58) Field of Search .................................. 174/255, 52.4, 174/257; 257/673, 778

(56) References Cited

U.S. PATENT DOCUMENTS 5,814,894 * 9/1998 Igarashi et al. .................. 257/778 X
5,821,626 * 10/1998 Ouchi et al. ......................... 257/778

FOREIGN PATENT DOCUMENTS 5-6850    1/1993  (JP) .
6-77293   3/1994  (JP) .
3008887   1/1995  (JP) .

* cited by examiner

Primary Examiner—Albert W. Paladini
(74) Attorney, Agent, or Firm—Rosenthal & Osha L.L.P.

(57) ABSTRACT

The present invention provides a circuit substrate containing a conductive circuit on an insulating base, an electrode for connection to an IC and an electrode for connection to a mother board substrate, which eliminates the step of bonding the film-like insulating base and the conductive circuit to simplify the manufacturing process.

9 Claims, 4 Drawing Sheets

CIRCUIT BOARD AND PRODUCTION METHOD THEREOF

FIELD OF THE INVENTION

The present invention relates to a circuit substrate for mounting a semiconductor device, particularly a circuit substrate which can be adapted to fine-pitch wiring of a semiconductor device or high-density packaging, as well as a process for manufacturing it.

PRIOR ART

Previously known circuit substrates of this kind have a structure as described in, for example, JPA No. 77293/94.

As shown in FIG. 4, this semiconductor device 101 comprises a conductive circuit 105 buried not to be bared from both faces of insulating layers 103, 104, and pairs of conducting paths 106, 107 opening to both faces of the conductive circuit 105 and displaced from each other along the plane of the conductive circuit 105. The conducting paths 106, 107 are connected to bumps 108, 109, respectively, whereby the conductive circuit 105 is connected to the bumps 108, 109 via the conducting paths 106, 107, respectively.

The bumps 108 formed in the conducting paths 106 on one side of a film carrier 102 are electrically connected to electrodes 112 formed on a substrate 111 of a semiconductor element 110 by contact therewith, whereby the semiconductor element 110 is mounted on the film carrier 102.

An insulating resin layer 113 is formed in contact with the upper face of the insulating layer 103 to cover the semiconductor element 110.

However, said prior art involving inserting the conductive circuit 105 between the film-like insulating layers 103, 104 required the step of bonding them with an adhesive or the like, resulting in complication of the manufacturing process.

This semiconductor device 101 is mounted on a mother board 114 generally by soldering the bumps 109 projecting beneath the insulating layer 104 to a lead pattern 116 on the mother board 114 by reflow-soldering, but the bumps 109 to be connected to the semiconductor element 110 may also be fused during then to cause disadvantages in mounting operations such as misalignment of the semiconductor element 110.

In view of the above problems, an object of the present invention is to provide a circuit substrate comprising a conductive circuit on an insulating base, an electrode for connection to an IC (Integrated Circuit) and an electrode for connection to a mother board substrate, which eliminates the step of bonding the film-like insulating base and the conductive circuit to simplify the manufacturing process, as well as a process for manufacturing it.

Another object of the present invention is to provide a circuit substrate comprising a conductive circuit on an insulating base, an electrode for connection to an IC and an electrode for connection to a mother board substrate, wherein only the surface portion of the metal projection for connection to a mother board substrate can be fused during soldering the circuit substrate to a mother board substrate to ensure reliable packaging, as well as a process for manufacturing it.

DISCLOSURE OF THE INVENTION

The present invention provides a circuit substrate for mounting an IC device on a mother board substrate, comprising:

a first insulating base made of a polyimide obtained by terminating imidation reaction of a polyamide acid as a precursor for the polyimide, a conductive circuit formed on said first insulating base, a second insulating base formed on said first insulating base carrying said conductive circuit and made of a polyimide obtained by terminating imidation reaction of a polyamide acid as a precursor for the polyimide, an electrode for connection to the mother board substrate, which is connected to said conductive circuit and projects from said first insulating base, and an electrode for connection to the IC, which is connected to said conductive circuit and projects from said second insulating base.

The present invention also provides a circuit substrate for mounting an IC device on a mother board substrate, comprising:

a first insulating base, a conductive circuit formed on said first insulating base, a second insulating base formed on said first insulating base carrying said conductive circuit, an electrode for connection to the mother board substrate, which is connected to said conductive circuit and projects from said first insulating base to form a metal projection on its surface, and an electrode for connection to the IC, which is connected to said conductive circuit and projects from said second insulating base to form a metal projection on its surface with the surface portion having a melting point higher than the melting point of the metal projection of said electrode for connection to the mother board substrate.

In the circuit substrate according to the present invention, the melting point of the surface portion of the metal projection of the electrode for connection to the IC may be at least 50° C. higher than the melting point of the metal projection of the electrode for connection to the mother board substrate.

In the circuit substrate according to the present invention, the first and second insulating bases may be made of a polyimide obtained by terminating imidation reaction of a polyamide acid as a precursor for the polyimide.

The present invention also provides a process for manufacturing a circuit substrate for mounting an IC device on a mother board substrate, comprising the steps of:

applying a polyamide acid solution as a precursor for a polyimide on a metal foil and terminating imidation reaction thereof to form a first insulating base layer made of the polyimide, processing said metal foil to form a conductive circuit on said first insulating base layer, applying a polyamide acid solution as a precursor for a polyimide on said first insulating base layer carrying said conductive circuit and terminating imidation reaction thereof to form a second insulating base layer made of the polyimide, forming an electrode for connection to the mother board substrate, which is connected to said conductive circuit and projects from said first insulating base, and forming an electrode for connection to the IC, which is connected to said conductive circuit and projects from said second insulating base.

The process for manufacturing a circuit substrate according to the present invention may further comprises the step of forming through holes for forming electrodes in the first and second insulating base layers by photolithography after applying a polyamide acid solution.

The process for manufacturing a circuit substrate according to the present invention may further comprises the steps of forming a metal projection on the surface of the electrode for connection to the mother board substrate, and forming a metal projection on the surface of the electrode for connection to the IC with the surface portion having a melting point higher than the melting point of the metal projection of said electrode for connection to the mother board substrate.

According to the present invention as characterized above, the first and second insulating bases are made of a polyimide obtained by imidation of a polyamide acid to eliminate the previously required step of bonding the film-like insulating bases and the conductive circuit, whereby the manufacturing process can be simplified to attain improved productivity and reduced costs.

According to the present invention, through holes for forming electrodes can be provided more readily than according to the prior art, by forming through holes for forming electrodes in the first and second insulating base layers by photolithography after applying a polyamide acid solution.

Also according to the present invention, the melting point of the surface portion of the metal projection for connection to an IC can be higher than the melting point of the metal projection for connection to a mother board substrate, particularly at the surface portion thereof, by forming a metal layer such as a solder layer on the surface of the metal projection for connection to an IC by plating or other means.

According to the present invention, the melting point of the surface portion of the metal projection for connection to an IC can be higher than the melting point of the metal projection for connection to a mother board substrate, whereby only the solder layer formed on the surface portion of the metal projection for connection to a mother board substrate can be fused while the metal projection for connection to an IC remains unfused during mounting the circuit substrate on a mother board substrate by, for example, soldering, to ensure reliable packaging free from misalignment of the semiconductor (IC) device or other disadvantages.

Especially when the melting point of the surface portion of the metal projection for connection to an IC is at least 50° C. higher than the melting point of the metal projection for connection to a mother board substrate in the present invention, only the solder layer formed on the surface portion of the metal projection for connection to a mother board substrate can be reliably fused.

BRIEF DESCRIPTION OF THE DRAWINGS

A preferred embodiment of a circuit substrate according to the present invention and a process for manufacturing it will now be described in detail with reference to the accompanying drawing in which.

THE MOST PREFERRED EMBODIMENT OF THE INVENTION

Figure 1:
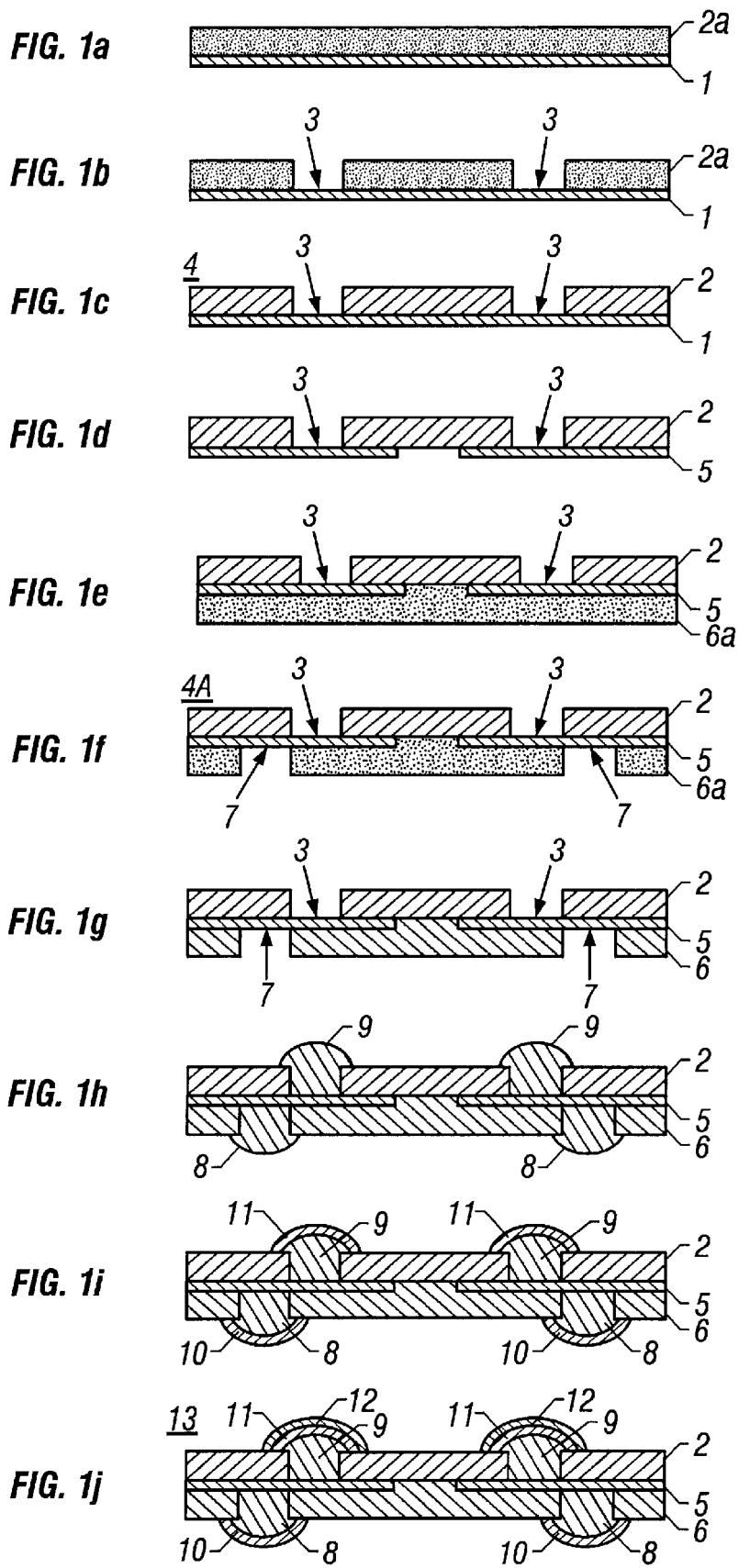
FIGS. 1a–1j is a flow sheet showing a sequence of steps of a process for manufacturing a circuit substrate according to one embodiment of the present invention in order.

FIGS. 1a–1j is a flow sheet showing a sequence of steps of a process for manufacturing a circuit substrate according to the present embodiment in order. The circuit substrate according to the present embodiment is applied to a film carrier for CSP (Chip Size/Scale Package).

As shown in FIG. 1a, a copper foil 1 having a somewhat larger area than that of an IC chip to be mounted is first prepared, and a polyamide acid mixed solution as a precursor for a polyimide is applied on the entire upper face of the copper foil 1 to form a polyamide acid layer 2a.

The thickness of the copper foil 1 is not specifically limited, but preferably about 1–50 $\mu$m, more preferably 8–18 $\mu$m.

The thickness of the polyamide acid layer 2a is not specifically limited either, but preferably about 5–75 $\mu$m, more preferably 5–25 $\mu$m.

Then, through holes 3 for forming bumps are formed by a known photolithographic process at predetermined portions of the polyamide acid layer 2a, as shown in FIG. 1b. Namely, a photoresist is applied on the polyamide acid layer 2a, dried, then exposed and developed to form a predetermined resist pattern (not shown). Portions corresponding to through holes 3 are etched to remove the resist pattern at those portions, whereby a substrate 4 having through hole 3 for forming bumps are obtained.

Here, the diameter of each through hole 3 is preferably 50–300 $\mu$m, more preferably 100–200 $\mu$m.

The substrate 4 is heated at a temperature of about 280–400° C. for about 5 minutes to terminate imidation reaction of the polyamide acid and to cure it.

Thus, a polyimide layer 2 having through holes 3 at bump-forming portions is formed on the upper face of the copper foil 1, as shown in FIG. 1c.

Figure 2:
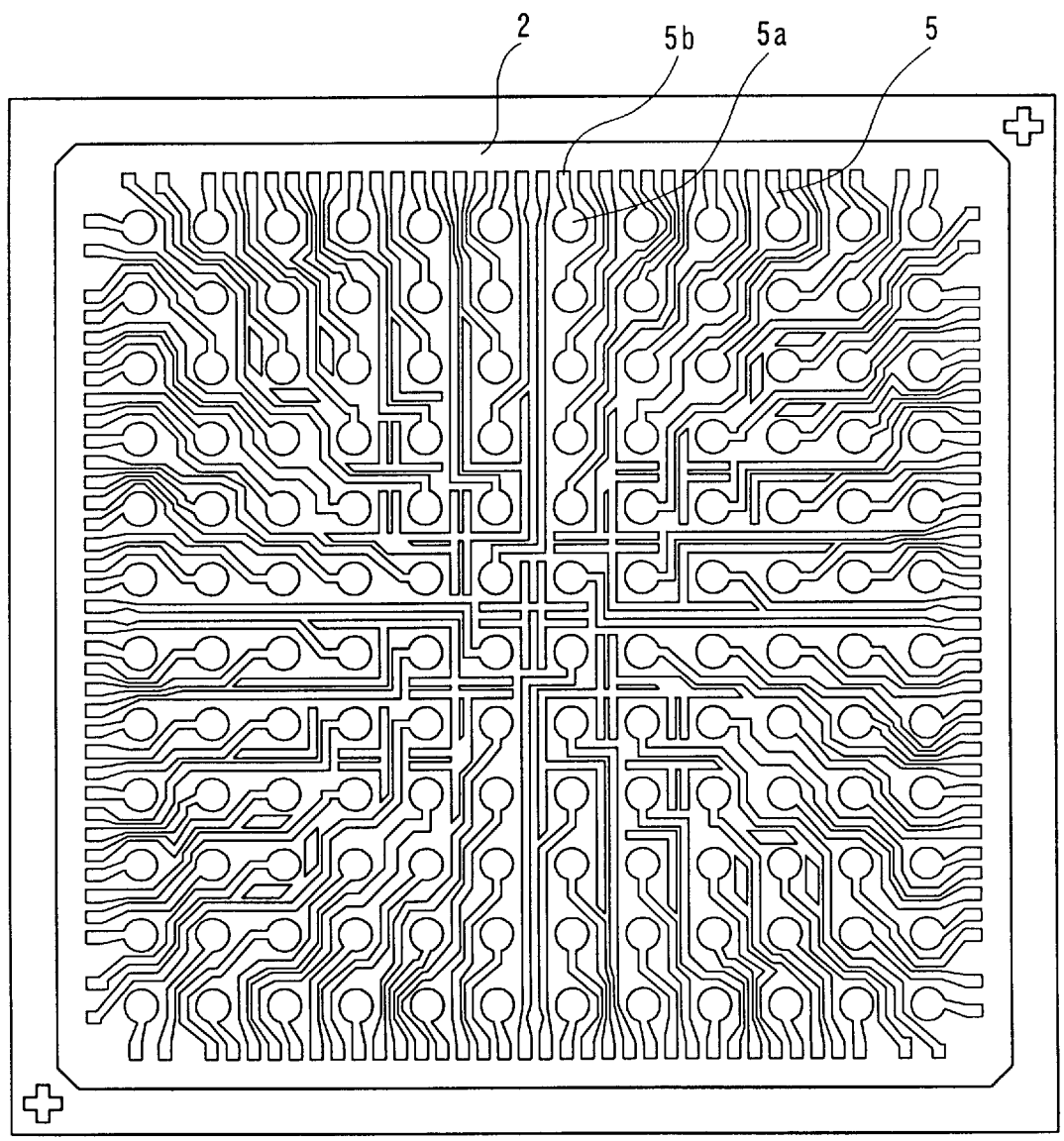
FIG. 2 is a plan view showing an example of a pattern of a conductive circuit formed on the circuit substrate according to the same embodiment.

Then, the copper foil 1 is etched to leave a pattern as shown, for example, in FIG. 2 by subjecting the back face of the copper foil 1 to a known photolithographic process to form a conductive circuit 5 on the polyimide layer 2.

Here, the conductive circuit 5 formed on the polyimide layer 2 has lands 5a for forming bumps 9 for connection to a mother board substrate and lands 5b for forming bumps 8 for connection to an IC chip, as shown in FIG. 2.

Here, the diameter of each land 5a is preferably 100–500 $\mu$m more preferably 200–300 $\mu$m.

The dimensions of each land 5b are preferably (100–200) $\mu$m×(200–500) $\mu$m, more preferably (100–150) $\mu$m× (300–400) $\mu$m.

Then, said mixed polyamide acid solution is applied on the entire back face of the copper foil 1 to form a polyamide acid layer 6a, as shown in FIG. 1e.

Here, the thickness of the polyamide acid layer 6a is not specifically limited, but preferably 5–75 $\mu$m, more preferably 5–10 $\mu$m.

Then, through holes 7 for forming bumps are formed at predetermined portions of the polyamide acid layer 6a by said photolithographic process as shown in FIG. 1f, and the substrate 4A is heated at a temperature of about 280–400° C. for about 5 minutes to terminate imidation reaction of the polyamide acid and cure it.

Thus, a polyimide layer 6 having through holes 7 at bump-forming portions is formed on the back face of the copper foil 1, as shown in FIG. 1g.

Here, the dimensions of each through hole 7 are preferably about (100–200) $\mu$m×(200–500) $\mu$m.

Then, copper, for example, is deposited and grown by plating or other means in said through holes 3,7 in the polyimide layers 2,6 on both faces of the conductive circuit 5 to form projecting bumps 8, 9, as shown in FIG. 1h.

Here, the height of each bump 8 is not specifically limited, but preferably 10–150 μm, more preferably 15–300 μm.

The height of each bump 9 is not specifically limited either, but preferably 10–500 μm, more preferably 100–300 μm.

The bumps 8, 9 may be in various forms other than mushroom shape as shown in FIG. 1.

Then, high melting point solder layers 10, 11 are formed with a high melting point solder on the surface of the respective bumps 8, 9, as shown in FIG. 1i.

Here, the melting point of the high melting point solder is not specifically limited, but preferably about 220–400° C.

Such a high melting point solder includes, for example, Au/Sn solder, high melting point (melting point of about 260° C.) Pb/Sn solder, etc.

The thickness of the high melting point solder layers 10, 11 is not specifically limited either, preferably 0.1–10 μm, more preferably 0.5–5 μm.

Then, a low-melting solder layer 12 is formed with a low-melting solder having a melting point of about 180° C. (for example, Pb/Sn solder) only on the surface of the high melting point solder layer 11 on the bumps 9 on the upper face as shown in FIG. 1j by masking the high melting point solder layer 10 on the bumps 8 on the polyimide layer 6 on the back face with a tape or the like not shown, to give a circuit substrate 13 according to the present embodiment.

The difference between the melting point of the high melting point solder used for the high melting point solder layers 10, 11 and the melting point of the low-melting solder used for the low-melting solder layer 12 is preferably 50° C. or more.

In case of the circuit substrate according to the present embodiment as described above, polyimide layers 2, 6 are formed on both faces of a copper foil 1 by imidation of a polyamide acid to eliminate the previously required step of bonding the film-like insulating bases and the conductive circuit, whereby the manufacturing process can be simplified to attain improved productivity and reduced costs.

FIGS. 3a–d is a flow sheet showing a process for mounting an IC chip using the circuit substrate according to the present embodiment.

Figure 3A:
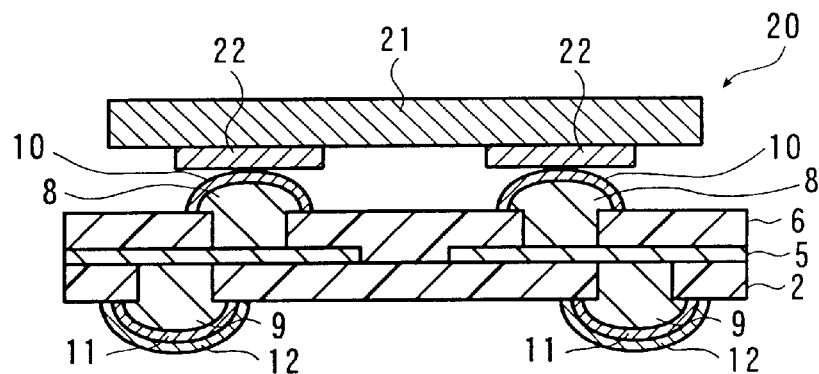
FIGS. 3a–3d is a flow sheet showing a process for mounting an IC chip using the circuit substrate according to the same embodiment.
Figure 3B:
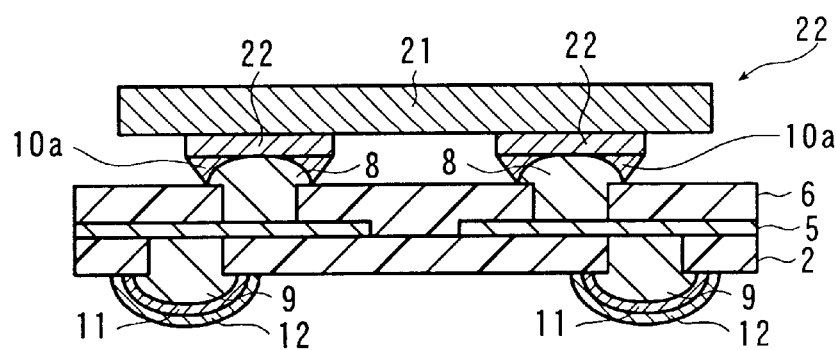

As shown in FIG. 3a, electrode portions 22 formed on a semiconductor substrate 21 of an IC chip 20 are first placed on the upper face of the upper bumps 8 of the circuit substrate 13. The bumps 8 are heated as such to fuse the high melting point solder layer 10, and the electrode portions 22 of the IC chip 20 and the bumps 8 are joined together by means of thus fused high melting point solder 10a, as shown in FIG. 3b.

Figure 3C:
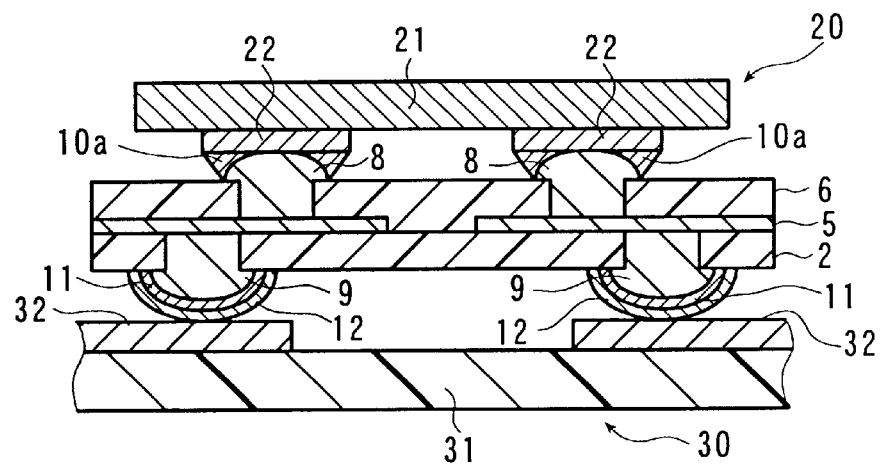

In order to mount the circuit substrate 13 carrying such an IC chip 20 on a mother board 30, the lower bumps 9 of the circuit substrate 13 are placed on the upper face of a conductive pattern 32 formed on a substrate 31 of the mother board 30, as shown in FIG. 3c.

The circuit substrate 13 is placed as such in a reflow furnace not shown, where it is subjected to reflow-soldering at a temperature which is higher than the melting point of the low-melting solder layer 12 but lower than the melting point of the high melting point solder layer 10.

Figure 3D:
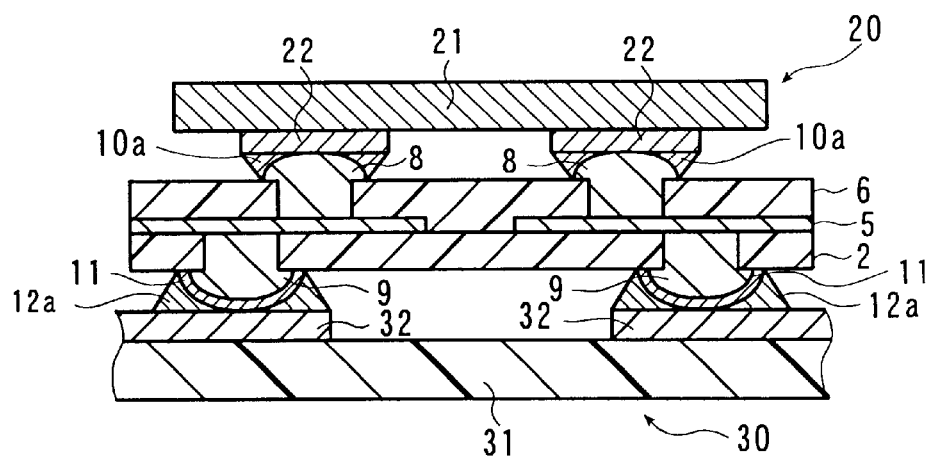
Figure 4:
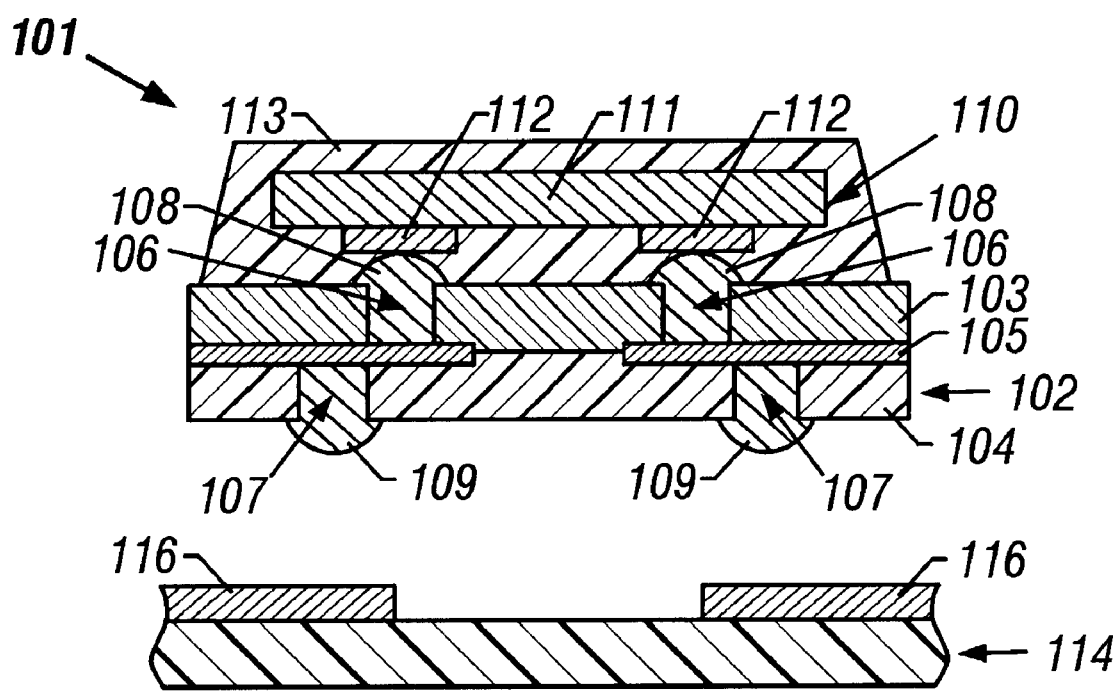
FIG. 4 is a sectional view showing a prior art.

As a result, the low-melting solder 12 on the bumps 9 on the side of the mother board 30 is fused, and the bumps 9 of the circuit substrate 13 on the side of the mother board 30 and the conductive pattern 32 on the mother board 30 are joined together by means of thus fused low-melting solder 12a, as shown in FIG. 3d. In this case, the high melting point solder 10a on the bumps 8 on the side of the IC chip 20 and the high melting point solder layer 11 on the side of the mother board 30 are not fused.

The circuit substrate 13 according to the present embodiment as described above is very advantageous in mounting operations, because the melting point of the solder applied on the bumps 8 for connection to an IC is higher than the melting point of the solder applied on the bumps 9 for connection to a mother board substrate, whereby only the low-melting solder layer 12 on the bumps 9 for connection to a mother board substrate can be fused while the high melting point solder 10a on the bumps 8 for connection to an IC on the upper face remains unfused during soldering the circuit substrate 13 to a mother board substrate 30.

The present invention is not limited to the foregoing embodiment, but may include various changes. For example, the material for the conductive circuit and electrodes is not limited to copper, but may also be aluminium or the like.

The shape of through holes formed in polyimide layers is not limited to a circle, but may also be square, rectangular, elliptical, etc.

Although the foregoing embodiment involves forming the high melting point solder layer 11 on the bumps 9 for connection to a mother board substrate and then forming the low-melting solder layer 12 thereon, the low-melting solder layer 12 may alternatively be formed directly on the bumps 9 for connection to a mother board substrate by masking the bumps 9 with a tape or the like during forming the high melting point solder layer on the bumps 8 for connection to an IC, for example.

The circuit substrate of the present invention may have a multilayer substrate structure by the build up method or the like.

In addition, the present invention is the most effective when applied to, but not limited to, a mounting substrate for CSP.

INDUSTRIAL APPLICABILITIES

As has been described, the circuit substrate according to the present invention is useful as a circuit substrate for mounting a semiconductor device, and especially suitable for fine-pitch wiring of a semiconductor device or high-density packaging.

What is claimed is:

1. A circuit substrate for mounting an IC device on a mother board substrate, comprising:

a first insulating base made of a polyimide obtained by terminating imidation reaction of a polyamide acid as a precursor for the polyimide, a conductive circuit formed on said first insulating base, a second insulating base formed on said first insulating base carrying said conductive circuit and made of a polyimide obtained by terminating imidation reaction of a polyamide acid as a precursor for the polyimide, an electrode for connection to the mother board substrate, which is connected to said conductive circuit and projects from said first insulating base, and an electrode for connection to the IC, which is connected to said conductive circuit and projects from said second insulating base wherein said conductive circuit is not bonded to said insulating base.

2. A circuit substrate for mounting an IC device on a mother board substrate, comprising:

a first insulating base, a conductive circuit formed on said first insulating base, a second insulating base formed on said first insulating base carrying said conductive circuit, an electrode for connection to the mother board substrate, which is connected to said conductive circuit and projects from said first insulating base to form a metal projection on its surface, and an electrode for connection to the IC, which is connected to said conductive circuit and projects from said second insulating base to form a metal projection on its surface with the surface portion of said second insulating base having a melting point higher than the melting point of the metal projection of said electrode for connection to the mother board substrate wherein said conductive circuit is not bonded to said insulating base.

3. A circuit substrate according to claim 2, wherein said first and second insulating bases are made of a polyimide obtained by terminating imidation reaction of a polyamide acid as a precursor for the polyimide.

4. A circuit substrate according to claim 2, wherein the melting point of the surface portion of the metal projection of the electrode for connection to the IC is at least 50° C. higher than the melting point of the metal projection of the electrode for connection to the mother board substrate.

5. A circuit substrate according to claim 4, wherein said first and second insulating bases are made of a polyimide obtained by terminating imidation reaction of a polyamide acid as a precursor for the polyimide.

6. A process for manufacturing a circuit substrate for mounting an IC device on a mother board substrate, comprising the steps of:

applying a polyamide acid solution as a precursor for a polyimide on a metal foil and terminating imidation reaction thereof to form a first insulating base layer made of the polyimide, processing said metal foil to form a conductive circuit on said first insulating base layer, applying a polyamide acid solution as a precursor for a polyimide on said first insulating base layer carrying said conductive circuit and terminating imidation reaction thereof to form a second insulating base layer made of the polyimide, forming an electrode for connection to the mother board substrate, which is connected to said conductive circuit and projects from said first insulating base, and forming an electrode for connection to the IC, which is connected to said conductive circuit and projects from said second insulating base wherein said conductive circuit is not bonded to said insulating base.

7. A process for manufacturing a circuit substrate according to claim 6, further comprising the steps of forming a metal projection on the surface of the electrode for connection to said mother board substrate, and forming a metal projection on the surface of the electrode for connection to said IC with the surface portion having a melting point higher than the melting point of the metal projection of said electrode for connection to the mother board substrate.

8. A process for manufacturing a circuit substrate according to claim 6, further comprising the step of forming through holes for forming electrodes in said first and second insulating base layers by photolithography after applying said polyamide acid solution.

9. A process for manufacturing a circuit substrate according to claim 8, further comprising the steps of forming a metal projection on the surface of the electrode for connection to said mother board substrate, and forming a metal projection on the surface of the electrode for connection to said IC with the surface portion having a melting point higher than the melting point of the metal projection of said electrode for connection to the mother board substrate.

* * * * *

UNITED STATES PATENT AND TRADEMARK OFFICE
CERTIFICATE OF CORRECTION

PATENT NO. : 6,323,434 B1
DATED : November 27, 2001
INVENTOR(S) : Hideyuki Kurita et al.

It is certified that error appears in the above-identified patent and that said Letters Patent is hereby corrected as shown below:

Column 5,
Line 2, please replace "15-300" with -- 15-30 --,

Column 6,
Line 31, please add -- 10 -- after "solder layer".

Signed and Sealed this

Nineteenth Day of August, 2003

JAMES E. ROGAN
*Director of the United States Patent and Trademark Office*